United States Patent [19]
Bakker

[11] Patent Number: 5,185,271
[45] Date of Patent: Feb. 9, 1993

[54] METHOD OF MANUFACTURING A BURIED-CHANNEL CHARGE-COUPLED IMAGE SENSOR

[75] Inventor: Jacobus G. C. Bakker, Eindhoven, Netherlands

[73] Assignee: U.S. Philips Corp., New York, N.Y.

[21] Appl. No.: 674,491

[22] Filed: Mar. 25, 1991

[30] Foreign Application Priority Data

Apr. 3, 1990 [NL] Netherlands ............ 9000776

[51] Int. Cl.⁵ ......................... H01L 21/266
[52] U.S. Cl. ......................... 437/3; 437/27; 437/958; 437/53
[58] Field of Search ............. 437/53, 2, 3, 27, 149, 437/150, 953, 955, 958; 148/DIG. 36

[56] References Cited

U.S. PATENT DOCUMENTS 4,649,430 3/1987 Hynecek ............ 358/213
4,994,405 2/1991 Jayakar ............ 437/53

FOREIGN PATENT DOCUMENTS 0143496 6/1985 European Pat. Off. .
52-27281 1/1977 Japan ............ 437/53

Primary Examiner—G. Fourson
Attorney, Agent, or Firm—Steven R. Biren

[57] ABSTRACT

In a method of manufacturing a raster transfer image sensor, the charge transport channels and the channel-bounding regions and the vertical anti-blooming channels are formed in a self-registering manner in that the channel-bounding regions are provided via a mask, and the intervening charge transport channels are provided in a maskless doping step. Since this doping is also carried out in the channel-bounding regions, a doping profile favorable for the photosensitivity is obtained in the channel-bounding regions with a maximum concentration at a distance from the surface.

2 Claims, 2 Drawing Sheets

5,185,271

METHOD OF MANUFACTURING A BURIED-CHANNEL CHARGE-COUPLED IMAGE SENSOR

BACKGROUND OF THE INVENTION

The invention relates to a method of manufacturing a charge-coupled image sensor arrangement of the buried channel type in which a region of a semiconductor body of a first conductivity type adjoining a surface is provided with a number of adjacent surface zones of the first conductivity type which form the buried channels of the charge-coupled device, and with channel-bounding surface zones of a second, opposite conductivity type situated between the surface zones of the first conductivity type and extending from the surface to a greater depth than the surface zones of the first conductivity type into the semiconductor body to below these latter surface zones, separating them at least partly from adjoining portions of the semiconductor body of the first conductivity type. The invention also relates to a charge-coupled image sensor arrangement obtained by this method.

Such a method and a device manufactured by this method are known from inter alia from the European Patent Application 143.196, laid open to public inspection.

In these devices, which are usually of the n-channel type, the n-type semiconductor body with which the manufacture starts forms a drain region for excess charge carriers which may be generated in the image sensor arrangement as a result of overexposure. In comparison with devices in which the drainage of excess charges takes place via drainage channels situated at the surface between the channels of the charge-coupled device, this vertical drainage has the advantage that the light sensitivity of the image sensor arrangement is not reduced. The overflow potential barrier between the n-type CCD channels and the n-type substrate are formed by the p-type channel-bounding zones provided on either side of each CCD channel, which zones diffuse from the sides of the CCD channels to below the CCD channels. This diffusion is usually carried through so far until the n-type CCD channels are completely separated from the n-type substrate by a p-type region. Doping and thickness of this p-type region are such that the region can be depleted over its entire thickness without breakdown. In an alternative embodiment, a narrow n-type region may be left below the CCD channels which acts as a vertical drainage channel.

The starting material for the manufacture of the known device is an n-type substrate at whose surface the p-type channel-bounding zones are provided by means of a mask, from which zones a continuous p-type region is formed by means of diffusion with constrictions where two zones diffusing towards one another adjoin one another. Subsequently, a second mask is used to provide the n-type surface zones for the CCD channels in such a way that the centers of these zones lie above or at least substantially above the said constrictions.

Two masks are required for the two subsequent doping steps in this known method, the second mask having to be aligned as accurately as possible relative to the pattern of p-type zones provided during the first doping step. The reproducibility of the device is reduced as a result of the spread in accuracy with which the n-type and p-type zones are provided relative to one another.

In addition, the known method described here has the result that the maximum doping concentration is at or close to the surface in the channel-bounding p-type zones. It is often necessary, furthermore, to provide an additional shallow p-layer in the channel-bounding region by means of a third mask for the drainage of generated holes. It will often be desirable in view of the photosensitivity for the maximum doping concentration to be at some distance away from the surface, the doping concentration decreasing from this point towards the surface.

SUMMARY OF THE INVENTION

The invention has for its object to provide a method of manufacturing a charge-coupled image sensor arrangement with vertical drainage of excess charges in which the channel-bounding zones and the CCD channels can be provided in a self-registering manner relative to one another by means of only a single mask. The invention has further for its object to provide a method by which the channel-bounding zones are given a favorable doping profile in relation to the photosensitivity.

According to the invention, a method of the kind described in the opening paragraph is characterized in that the channel-bounding zones are formed via a mask having windows which leave open those surface portions of the region which are situated between the buried channels to be formed, and in that the buried channels are formed by means of a doping step which is carried out uniformly over the entire region in a doping concentration which is lower than the doping concentration of the channel-bounding zones.

Thanks to the use of the method according to the invention, the positions of the channel-bounding zones and of the CCD channels are determined by a single mask. The net concentration of impurities of the second conductivity type is advantageously decreased in the channel-bounding zones in that impurities of the first conductivity type are introduced during the doping step for providing the CCD channels, also in the channel-bounding zones already present or yet to be provided. A special embodiment of a method according to the invention is characterized in that the doping steps are carried out in such a way that the net doping concentration of the channel-bounding zones in a direction transverse to the surface has a maximum which is situated at a finite distance away from the surface. The doping concentration of the channel-bounding regions may be so low at the surface that a great light sensitivity, in particular to blue light, is obtained, while the doping at the area of the maximum can be sufficiently high for obtaining a good channel separation and nevertheless a good drainage of generated charge carriers of the second type.

BRIEF DESCRIPTION OF THE DRAWING

The invention will be explained in more detail with reference to an embodiment and the accompanying diagrammatic drawing in which.

DESCRIPTION OF THE PREFERRED EMBODIMENTS

Figure 1:
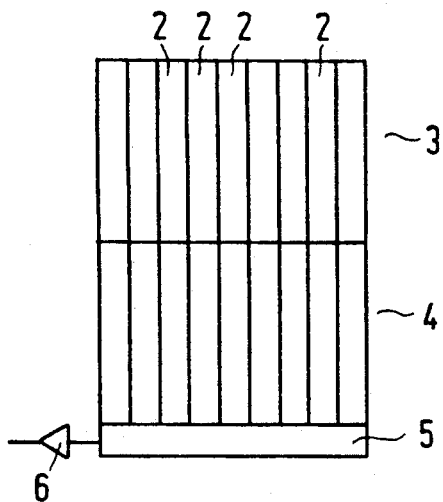
FIG. 1 gives a diagrammatic plan view of a charge-coupled image sensor arrangement of the raster transfer type.

It should be noted that the Figures are diagrammatic and not drawn to scale. Furthermore, the invention will be described with reference to an n-channel arrangement, but it will be obvious that the invention may be carried out in p-channel arrangements as well, for which it is sufficient to reverse the conductivity types mentioned here. The charge-coupled device according to FIG. 1 comprises a number of adjacent channels 2 which form an image sensor section 3 and an adjoining memory section. At the lower side of the memory section 4, the channels 2 issue into a horizontal read-out register 5 which is provided with an output amplifier 6.

Figure 2:
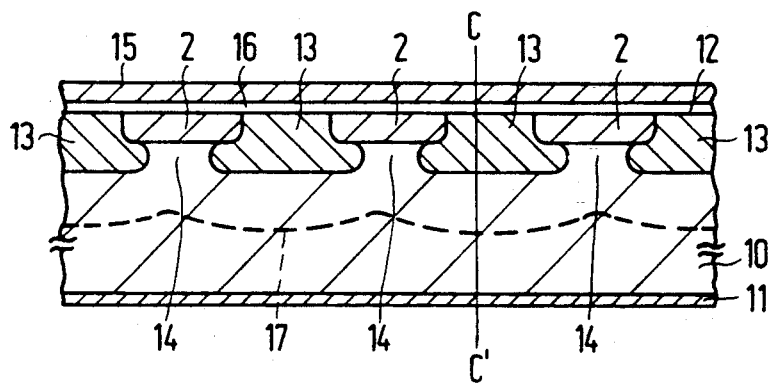
FIG. 2 gives a cross-section of the charge-coupled image sensor manufactured by the method according to the invention.

FIG. 2 shows a diagrammatic cross-section of the arrangement of FIG. 1 perpendicular to the charge transport direction. Only 3 CCD channels 2 have been represented in FIG. 2 so as not to make the drawing unnecessarily large. The arrangement is provided in a semiconductor substrate 10 of n-type silicon which is provided with a connection 11. For simplicity's sake, the connection 11 is shown at the lower side of the substrate, but it will be clear that the connection 11 may also be provided in a suitable spot at the upper side. It will further be clear that, instead of a uniformly n-doped substrate, a semiconductor body may be used of which only a region adjoining the upper surface is of the n-type. The body 10 is provided with n-type surface zones at the surface 12, which zones form the buried n-channels of the charge-coupled device. The channels 2 are mutually separated by the intervening p-type surface zones 13 which form channel-bounding zones. The zones 13 extend from the lateral edges of the n-type zones 2 to below the n-type zones 2 in the substrate 10 down to a greater depth in the substrate than the n-zones 2, thus separating the n-type zones 2 at least substantially from the surrounding portions of the n-type substrate. The zones 13 leave open n-type vertical channels 11 below the zones 2, through which channels an excess charge generated as a result of overexposure can be discharged to the substrate 10. In other embodiments, the zones 10 may extend so far below the n-type zones 2 that a continuous p-type region is formed below the zones 2. A system of clock electrodes (not shown in FIG. 1) is provided on the surface for applying suitable clock voltages so that a potential profile is created in the channels 2 with which charge packages can be stored and transported in the zones 2 In the cross-section of FIG. 2, a clock electrode 15 is shown, separated from the silicon by a gate dielectric 16.

The operation of the device is described in the cited European Patent Application 113.496. The radiation pattern to be converted is projected on the sensor section 3 and converted into a large number of charge packages there. After a certain integration period the generated charge packages are quickly transported to the memory section 4, which is screened from radiation. The information can be transported line by line from the memory section to the horizontal register and read out package by package at the output amplifier 6.

During operation the pn transitions between the p-type zones 13 and the n-type substrate 10 and the n-type surface zones are reverse-biased, so that the n-channels 11 are depleted over their entire thickness. The boundary of the depletion region in the n-type substrate 10 is indicated by the broken line 17. The potential in the channels 14 is such that, in the case of overexposure, charge can drain off to the substrate via the potential barrier induced in the channels 11 before spreading itself over the CCD channels 2 (blooming).

Figure 3:
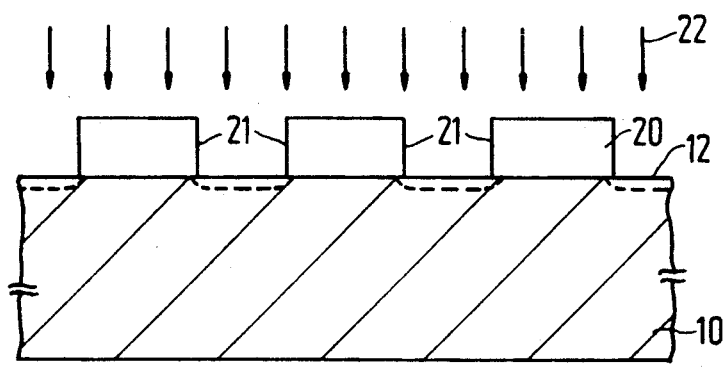
FIGS. 3 and 4 show the device of FIG. 2 in two stages of manufacture.
Figure 4:
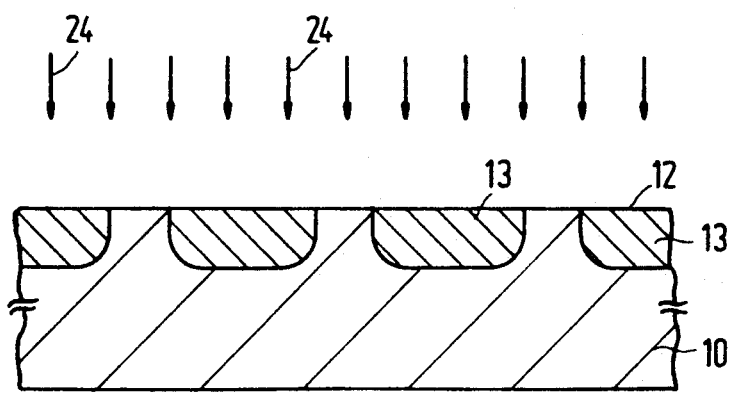

With reference to the FIGS. 3 and 4, a method will be described by which the arrangement described above may be manufactured in a self-registering, and thus very reproducible manner. The drawing merely indicates how the portion of the arrangement comprising the CCD channels 2 and the intervening channel-bounding regions 13 are manufactured. Other portions, in which the required electronics are provided, may be manufactured by process steps which are known per se and which are not described here FIG. 3 starts with the n-type semiconductor body 10 whose surface 12 is provided with a mask 20 having openings 21 which define the channel-bounding regions 13. The mask 20 may be formed, for example, from a photoresist layer. This layer may be provided directly on the silicon, as shown in the Figure, but it may also be separated from the silicon by an intermediate thin oxide layer. In a specific embodiment, the width of the openings 21 was approximately 2 $\mu$m and the width of the intervening photoresist tracks 20 approximately 4 $\mu$m. The thickness of the tracks 20 is chosen to be large enough to mask the subjacent silicon against implantation. The semiconductor body 10 is doped in the regions defined by the openings 21 in order to obtain the p-type channel-bounding zones 13 by means of a boron implantation, represented diagrammatically with the arrows 22 in the drawing. The zones 13 are obtained by further diffusion of the boron into the semiconductor body by means of a heating step after implantation. The final doping profile of the p-type zones 13 is represented diagrammatically by the curve A in FIG. 5. In this drawing, the doping concentration in atoms per $cm^3$ is plotted on the vertical axis; on the horizontal axis the depth 2 (in $\mu$m) from the surface is plotted. The maximum surface concentration in the channel-bounding zones is approximately $4.10^{16}$ at/$cm^3$. The zones 13 are diffused into the semiconductor body with a diffusion length of approximately 1 $\mu$m, so they also diffuse approximately 1 $\mu$m in the lateral direction away from the edges of the openings 21. The mask 20 is removed after implantation of boron ions (FIG. 4), after which a uniform n-type doping, for example with phosphorus ions 24, is carried out at the area of the CCD channels 2 yet to be formed and the p-type zones 13 mentioned above. The surface concentration of the phosphorus doping is, for example, approximately $2.10^{16}$ phosphorus atoms per $cm^3$ at a diffusion length of approximately 0.5 $\mu$m (curve B in FIG. 5). Owing to the uniform n-doping, the portions of the p-type zones 13 (FIG. 4) masked by the mask 20 and situated between the point P indicated in FIG. 5 and the edges of the p-type zones 13 are n-doped, i.e. a portion of approximately 0.2 $\mu$m measured from the edges. The situation shown in FIG. 2 is then obtained with n-type CCD channels 2 separated from the n-type substrate 10 by the p-type channel-bounding zones which extend to below the CCD channels. The width of the n-type CCD channels is approximately 5.1 $\mu$m at a depth of approximately 0.5 $\mu$m.

Figure 5:
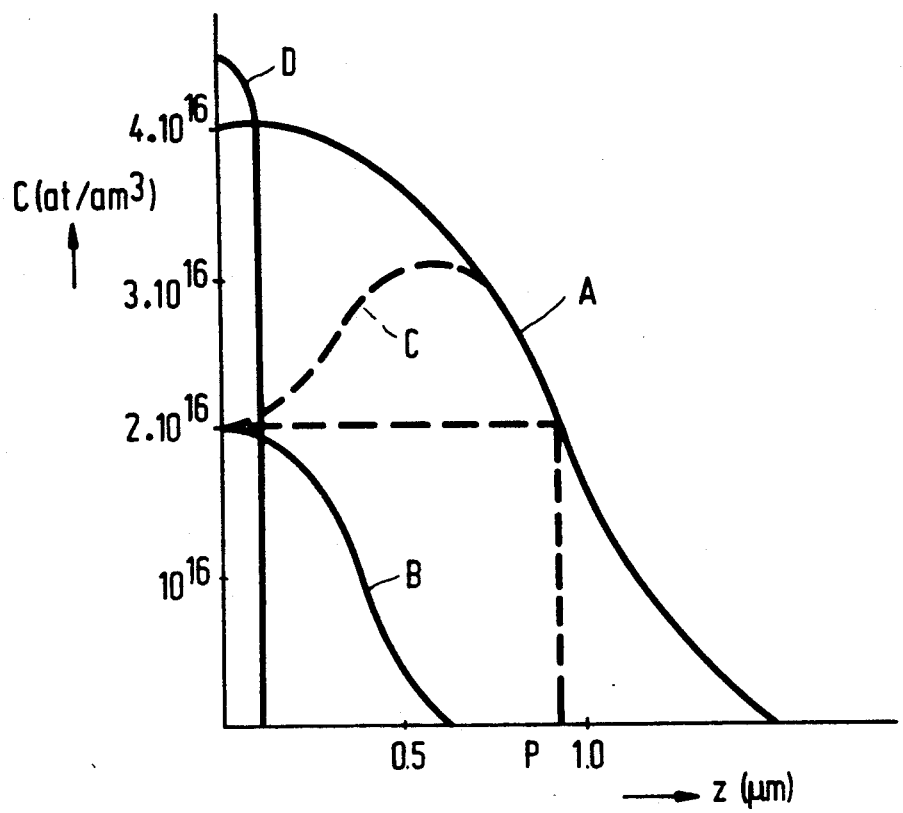
FIG. 5 shows the doping profile in the channel-bounding zones between two CCD channels as a function of the depth 2 from the surface.

In the process described here, the n-type channel zones are provided in a self-registering manner relative to the previously defined p-type zones 13. A critical alignment step can be avoided in this way, which is known to have various important advantages such as a higher yield, better reproducibility, and, if possible, a larger photosensitive surface area. In addition, a favorable doping profile is obtained in the channel-bounding zones 13 by the method according to the invention. In fact, since the phosphorus doping 24 takes place over the entire surface 2, the net surface concentration in the p-type zones 13 is decreased. FIG. 5 shows the doping profile of a channel-bounding zone 13 along the line c—c (FIG. 2) represented by the broken-line curve C. The net surface concentration in this example is reduced to approximately $2 \times 10^{16}$ atoms per $cm^3$ as a result of the phoshorus doping. This comparatively low value results in a comparatively high photosensitivity, in particular to blue light which is absorbed close to the surface. The doping concentration maximum lies at approximately 0.5 μm away from the surface and has a value of approximately $3 \times 10^{16}$ atoms. This concentration is sufficient for a good separation between the CCD channels and for a good discharge of the generated holes.

Figure 6:
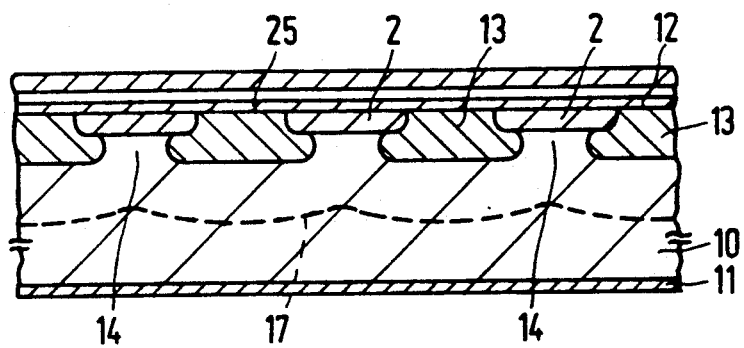
FIG. 6 shows a modification of the image sensor shown in FIG. 2.

In FIG. 6, a modification of the configuration shown in FIG. 2 is shown in cross-section, corresponding parts being given the same reference numerals as those in FIG. 2. Apart from the n-type doping to obtain the surface zones 2 according to the profile B in FIG. 5, a second n-type doping according to the profile D in FIG. 2 is also carried out in the device according to FIG. 6. This doping is very shallow and may have such a high concentration that a very narrow layer 25 of the channel-bounding regions 13 can become of the n-type, albeit of such a weak n-type that the regions 25 are fully depleted during operation and do not form connections between the zones 2. Simultaneously, highly doped n-type zones 26 are obtained in the charge transport channels 2, which zones are thin compared with the zones 2. The zones 26 give a doping profile which is favorable for the total quantity of charge which can be stored in the channels 2, such as is described in, for example, the Netherlands Patent 181.760. The zones 25 and 26 may be provided simultaneously by a uniform doping step over the entire surface of the CCD matrix.

It will be clear that the invention is not limited to the embodiment described here, but that many variations are possible to those skilled in the art within the scope of the invention. Thus the order in time of the n- and p-dopings may be reversed in the embodiment described, so that first a uniform n-type implantation is carried out, followed by a p-type doping localized by a mask. The invention may also be applied in sensor types other than FT sensors. The mask pattern 20 and/or the duration of the temperature treatment in which the implanted boron atoms diffuse into the substrate may be so shifted that the p-type surface zones 13 form a continuous region.

I claim:

1. A method of manufacturing a charge-coupled image sensor arrangement of the buried-channel type in which a region of a semiconductor body of a first conductivity type adjoining a surface is provided with a number of adjacent surface zones of the first conductivity type which form the buried channels of the charge-coupled device, and with channel-bounding surface zones of a second, opposite conductivity type situated between the surface zones of the first conductivity type and extending from the surface to a greater depth than the surface zones of the first conductivity type into the semiconductor body to below these latter surface zones, and separating them at least partly from adjoining and underlying portions of the semiconductor body of the first conductivity type, characterized in that the channel-bounding zones are first formed using a mask having windows which leave free those surface portions of the region which are situated between the buried channels to be formed, and in that the buried channels are then formed by means of a doping step which is carried out uniformly over the entire region in a doping concentration which is lower than the doping concentration of the channel-bounding zones.

2. A method as claimed in claim 1, characterized in that the doping steps are carried out in such a way that the net doping concentration of the channel-bounding zones in a direction transverse to the surface has a maximum which is situated at a finite distance away from the surface.

* * * * *